(12) United States Patent
Miyano et al.

(10) Patent No.: US 6,335,251 B2
(45) Date of Patent: Jan. 1, 2002

(54) SEMICONDUCTOR APPARATUS HAVING ELEVATED SOURCE AND DRAIN STRUCTURE AND MANUFACTURING METHOD THEREFOR

(75) Inventors: Kiyotaka Miyano; Ichiro Mizushima; Yoshitaka Tsunashima; Tomohiro Saito, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/824,215

(22) Filed: Apr. 3, 2001

Related U.S. Application Data

(62) Division of application No. 09/321,846, filed on May 28, 1999, now Pat. No. 6,232,641.

(30) Foreign Application Priority Data

May 29, 1998 (JP) ............................................. 10-150211

(51) Int. Cl.⁷ ............................................. H01L 21/336
(52) U.S. Cl. ...................... 438/300; 438/301; 438/303; 438/305; 438/585; 438/592
(58) Field of Search ................. 438/299–301, 438/303, 305, 585, 592

(56) References Cited

U.S. PATENT DOCUMENTS

| 5,168,072 A | 12/1992 | Moslehi ...................... 438/300 |
| 5,391,508 A | 2/1995 | Matsuoka et al. |
| 5,902,125 A | 5/1999 | Wu ............................. 438/300 |
| 5,967,794 A | 10/1999 | Kodama ...................... 438/300 |
| 6,025,242 A | 2/2000 | Ma et al. ..................... 438/303 |
| 6,054,355 A | 4/2000 | Inumiya et al. |
| 6,117,741 A | 9/2000 | Chatterjee et al. .......... 438/299 |
| 6,143,593 A | 11/2000 | Augusto ...................... 438/300 |
| 6,156,613 A | 12/2000 | Wu ............................. 438/300 |
| 6,190,977 B1 | 2/2001 | Wu ............................. 438/300 |

FOREIGN PATENT DOCUMENTS

| JP | 363070573 | 3/1988 | ........... H01L/29/78 |
| JP | 403018062 | 1/1991 | ......... H01L/29/784 |
| JP | 2720677 | 11/1997 | |
| JP | 10-135453 | 5/1998 | |

OTHER PUBLICATIONS

Miyano et al., "Facet–Free Si Selective Epitaxial Growth Adaptable to Elevated Source/Drain MOSFETs with Narrow STI", Extended Abstract of the 1998 International Conference on Solid State Devices and Materials, pp. 420–421, (1998).

Primary Examiner—Charles Bowers
Assistant Examiner—Thanh Nguyen
(74) Attorney, Agent, or Firm—Finnegan, Henderson, Farabow, Garrett & Dunner, L.L.P.

(57) ABSTRACT

A semiconductor apparatus on which a MOS transistor having an elevated source and drain structure is formed is arranged to have a gate electrode which is formed on the surface of a silicon substrate through an insulating film. An elevated source film and an elevated drain film each having at least a surface portion constituted by a metal silicide film, being conductive and elevated over the surface of the silicon substrate are formed on a source region and a drain region on the surface of the silicon substrate. Thus, a MOS transistor having a structure in which the surfaces of the source region and the drain region are elevated over the surface of the silicon substrate is formed. A first gate-side-wall insulating film is formed on the side wall of the gate electrode of the MOS transistor and having a bottom surface formed apart from the surface of the silicon substrate. A second gate-side-wall insulating film is formed between the first gate-side-wall insulating film and the gate electrode and on the bottom surface of the first gate-side-wall insulating film. The portion formed on the bottom surface exists in an inner bottom surface portion of the bottom surface of the first gate-sidewall insulating film adjacent to the gate electrode. The elevated source film and the elevated drain film are free from any facet in portions made contact with the first gate-side-wall insulating film.

4 Claims, 10 Drawing Sheets

STATE IN WHICH SILICON HAS BEEN EPTAXIALLY GROWN IN SOURCE AND DRAIN REGIONS

F I G. 4

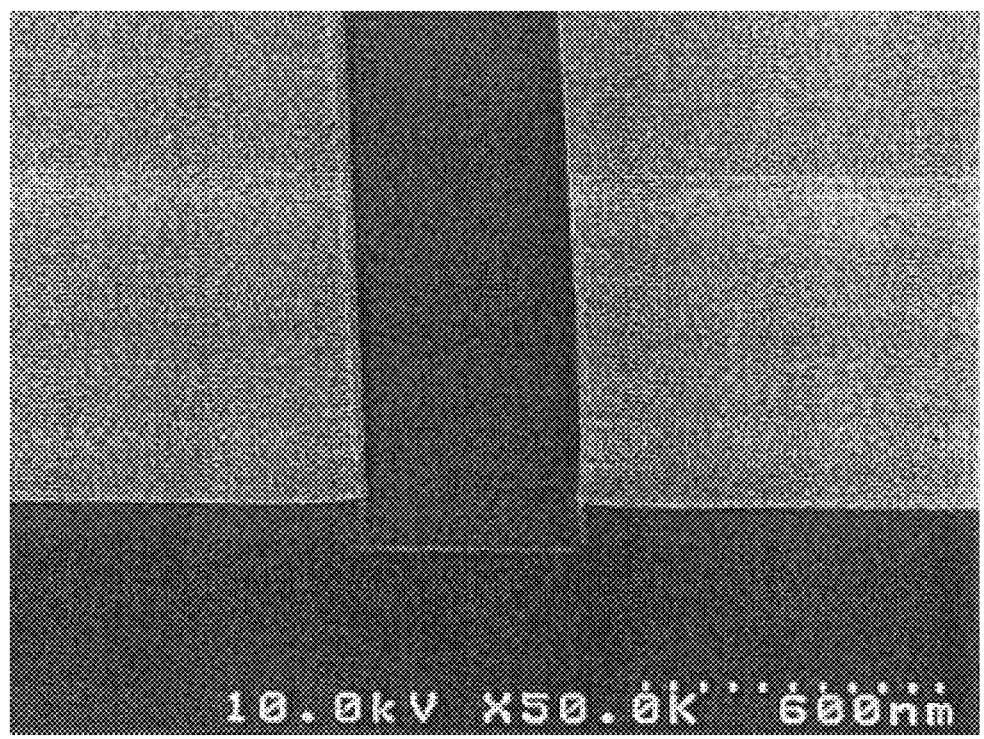
F I G. 8

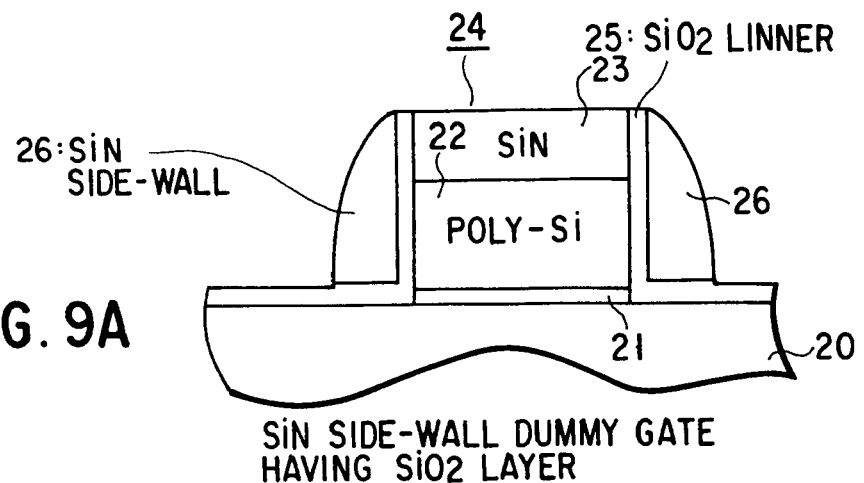
FIG. 9A  SiN SIDE-WALL DUMMY GATE HAVING SiO2 LAYER
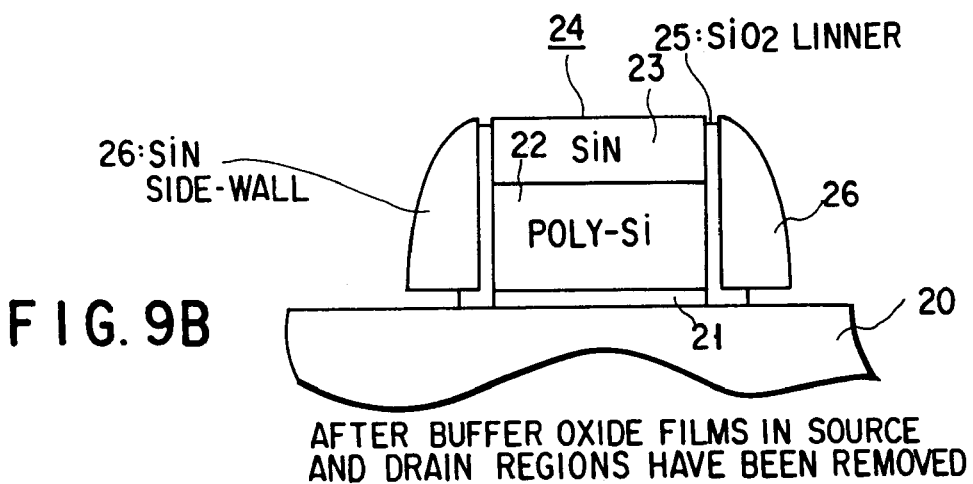
FIG. 9B  AFTER BUFFER OXIDE FILMS IN SOURCE AND DRAIN REGIONS HAVE BEEN REMOVED
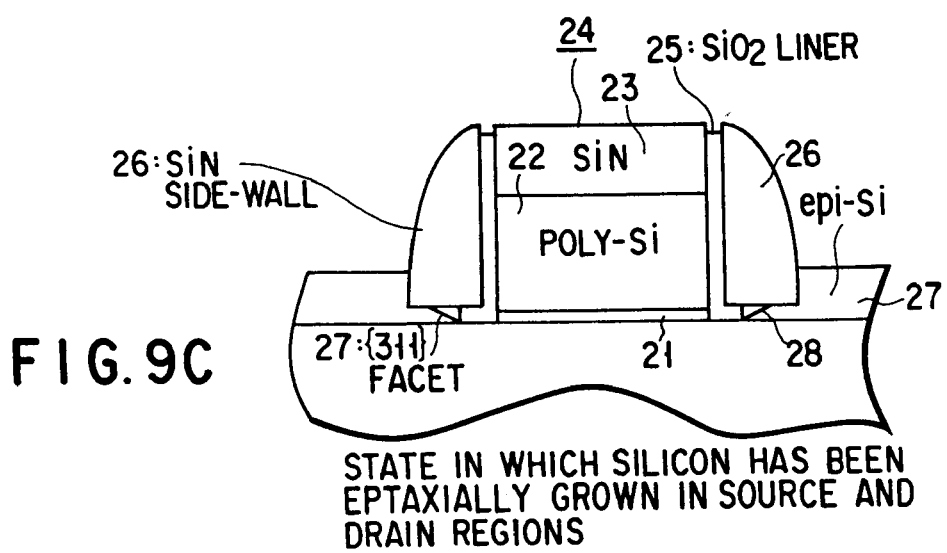
FIG. 9C  STATE IN WHICH SILICON HAS BEEN EPTAXIALLY GROWN IN SOURCE AND DRAIN REGIONS

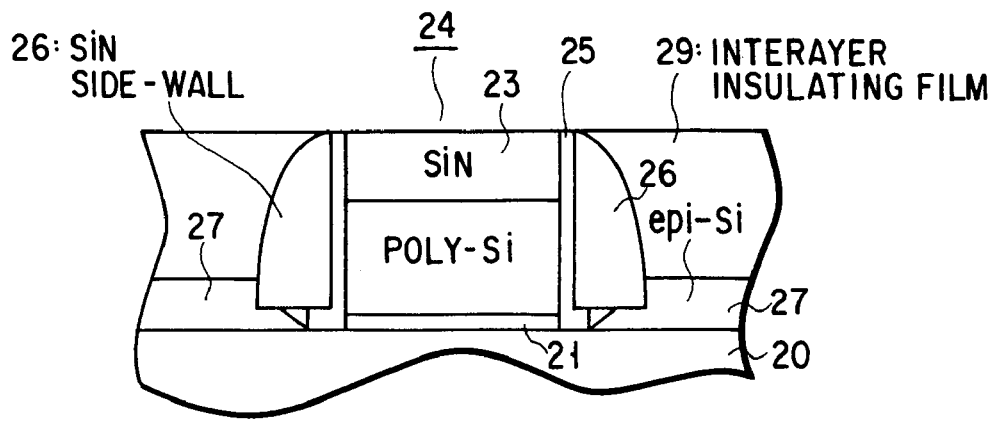
DEPOSIT INTERAYER INSULATING FILM, AND THEN FLATTEN THE SURFACE TO EXPOSE UPPER SURFACE OF DUMMY GATE
F I G. 9D
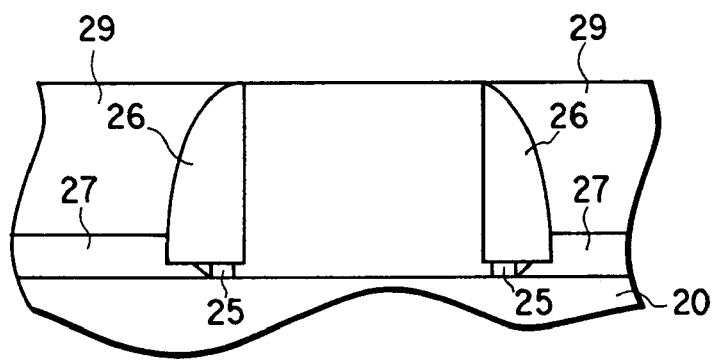
F I G. 9E
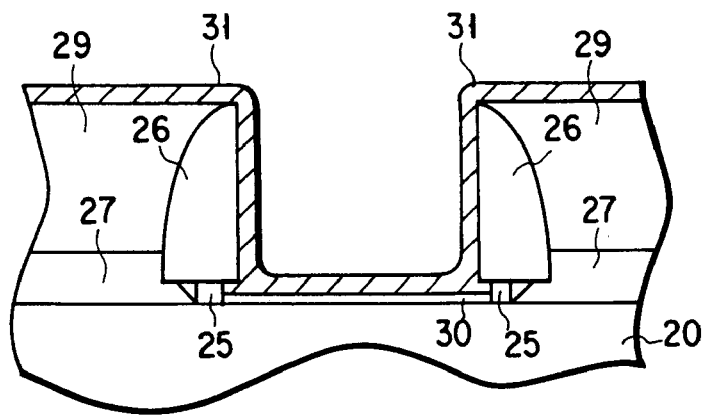
F I G. 9F

FIG. 9G STATE IN WHICH DUMMY GATE AND LOWER BUFFER OXIDE FILM HAVE BEEN REMOVED

FIG. 9H STATE IN WHICH GATE INSULATING FILM HAS BEEN DEPOSITED GATE INSULATING FILM

SEMICONDUCTOR APPARATUS HAVING ELEVATED SOURCE AND DRAIN STRUCTURE AND MANUFACTURING METHOD THEREFOR

This is a division of application Ser. No. 09/321,846, filed May 28, 1999, now U.S. Pat. No. 6,232,641 which is incorporated herein by reference.

BACKGROUND OF THE INVENTION

The present invention relates to a semiconductor apparatus and a manufacturing method therefor, and more particularly to a semiconductor apparatus incorporating a MOS transistor which has a structure in which a source region and a drain region are elevated over the original surface of the silicon substrate and a manufacturing method therefor.

In an industrial field of the MOS type integrated circuit, a SALICIDE (Self Aligned Silicide) technique has been developed to realize a precise and high-speed device. The SALICIDE technique is arranged to form a metal silicide film, such as a Co silicide film or a Ti silicide film, on a source diffusion layer and a drain diffusion layer, the metal silicide film being formed in a self-aligning manner.

As the degree of precision of the structure is enhanced, there arises a necessity of forming the source diffusion layer and the drain diffusion layer in a shallower position from the surface of the substrate.

When the foregoing SALICIDE technique is employed to manufacture a precise device, silicide forming reactions between a metal film having a high melting point and the silicon substrate proceed while the metal film having a high melting point consumes silicon of the silicon substrate. Therefore, joint between a well and the source region or the well and the drain region cannot easily be formed in a shallow region from the surface of the substrate.

To solve the above-mentioned problem, epitaxial silicon films are formed on the surfaces of the source region and the drain region on the surface of the silicon substrate. Thus, the surfaces of the source region and the drain region are elevated over the original surface of the silicon substrate.

Then, ions of impurities are implanted into the surface of the substrate through the epitaxial silicon film, and then the metal film having a high melting point is deposited to perform the silicide forming reactions. Thus, the source region and the drain region each having low resistance are formed. Simultaneously, joints are formed in a shallow region from the surface of the substrate.

The foregoing technique for epitaxial-growing silicon on the source region and the drain region to elevate the surfaces of the source region and the drain region over the original surface of the silicon substrate is called an "elevated source and drain technique".

The structure in which the source region and the drain region are elevated over the original surface of the substrate is hereinafter called an "elevated source and drain structure".

FIG. 1 is cross sectional view showing a MOS transistor having the conventional elevated source and drain structure.

A gate electrode 83 made of polysilicon is formed on a silicon substrate 81 through a gate oxide film 82. A gate-side-wall SiN film 85 made of silicon nitride (SiN) is formed on the side wall of the gate electrode 83 through a SiO$_2$ liner 84.

A source diffusion layer 86 and a drain diffusion layer 87 are formed on the surface of the silicon substrate 81 in a self-aligning manner. A source silicon film 88 and a drain silicon film 89, each of which is made of single crystal silicon, are, by the epitaxial growth method, formed on the source diffusion layer 86 and the drain diffusion layer 87, respectively.

The MOS transistor of the type having the elevated source and drain structure, however, suffers from the following problems.

That is, the elevated source film 88 and the elevated drain film 89 are, however, caused to have facets 90 formed adjacent to the lower ends of the gate-side-wall SiN film 85. Therefore, the degree of elevation of the source region and the drain region is undesirably restrained.

As a result, a problem arises when ions of impurities are implanted into the surface of the substrate through the elevated source film 88 and the elevated drain film 89 to form the source diffusion layer 86 and the drain diffusion layer 97. That is, the regions of the source diffusion layer 86 and the drain diffusion layer 87, in each of which satisfactory elevation cannot be realized, are undesirably formed deeply. Moreover, the concentration of the impurities is raised excessively.

As a result, electric fields produced in channel regions during the operation of the transistor form a depletion layer in the channel region. Thus, $|V_{th}|$ (an absolute value of a threshold voltage) is lowered and durability between the source and the drain deteriorates. That is, a problem of a short-channel effect arises.

Since the portions encountered the facet inhibits formation of the joints in a shallow region from the surface of the substrate, a joint leak current is produced which causes the characteristics of the transistor to excessively deteriorate.

When the SALICIDE technique is employed to manufacture a precise MOS transistor, silicide forming reactions proceed while the metal film having a high melting point consumes silicon of the silicon substrate. Therefore, a shallow joint cannot easily be formed.

Therefore, a MOS transistor of a type having the elevated source and drain structure has been suggested. That is, the following method has been suggested in which the epitaxial silicon films are formed on the source region and the drain region to elevate the surfaces of the source region and the drain region over the original surface of the substrate. Then, implantation of ions of impurities and the silicide reactions are performed. Thus, the source diffusion layer and the drain diffusion layer each of which has low resistance and which are joined at shallow positions are formed.

The epitaxial silicon film, however, encounters formation of a facet adjacent to the lower ends of the gate edges. As a result, the source region and the drain region cannot satisfactorily be elevated in the portions encountered the formation of the facets.

As a result, the deep source diffusion layer and drain diffusion layer in the portions in which satisfactory elevation has been inhibited are formed deeply and caused to contain impurities in high concentrations. Therefore, there arises a problem in that the short-channel effect occurs. What is worse, a shallow joint cannot be formed in the portion encountered formation of the facet. As a result, there arises another problem in that a joint leak current is produced.

BRIEF SUMMARY OF THE INVENTION

In view of the foregoing, an object of the present invention is to provide a semiconductor apparatus on which a MOS transistor is formed which has an elevated source and drain structure to prevent a short-channel effect and a joint leak current, and a manufacturing method therefor.

To achieve the object, according to one aspect of the present invention, there is provided a semi-conductor apparatus on which a MOS transistor having an elevated source and drain structure is formed, comprising:

a silicon substrate;

a gate electrode formed on the surface of the silicon substrate through an insulating film;

an elevated source film and an elevated drain film formed in a source region and a drain region of the surface of the silicon substrate and each having at least a surface made of a metal silicide film and conductivity such that the elevated source film and the elevated drain film are elevated over the surface of the silicon substrate and the MOS transistor having a structure that the surfaces of the source region and the drain region are elevated over the surface of the silicon substrate owning to the formation of the elevated source film and the elevated drain film;

a first gate-side-wall insulating film formed on the side wall of a gate electrode of the MOS transistor and having a bottom surface formed apart from the surface of the silicon substrate; and a second gate-side-wall insulating film formed between the first gate-side-wall insulating film and the gate electrode and on the bottom surface of the first gate-side-wall insulating film, made of a material which can be etched at an etching rate lower than that permitted for a material of the first gate-side-wall insulating film and having the portion which is formed on the bottom surface of the first gate-side-wall insulating film and which exists in an inner bottom surface portion adjacent to the gate electrode.

According to another aspect of the present invention, there is provided a semiconductor apparatus on which a MOS transistor having an elevated source and drain structure is formed, comprising:

a silicon substrate;

a gate electrode formed on the surface of the silicon substrate through an insulating film;

an elevated source film and an elevated drain film formed in a source region and a drain region of the surface of the silicon substrate and each having at least a surface made of a metal silicide film and conductivity such that the elevated source film and the elevated drain film are elevated over the surface of the silicon substrate and the MOS transistor having a structure that the surfaces of the source region and the drain region are elevated over the surface of the silicon substrate owning to the formation of the elevated source film and the elevated drain film;

a first gate-side-wall insulating film formed on the side wall of a gate electrode of the MOS transistor, having a bottom surface formed apart from the surface of the silicon substrate and made of a silicon compound containing nitrogen; and a second gate-side-wall insulating film formed between the first gate-side-wall insulating film and the gate electrode and on the bottom surface of the first gate-side-wall insulating film and made of a silicon compound which can be etched at an etching rate lower than that permitted for the silicon compound, which has a composition ratio of nitrogen/silicon which is lower than that of the first gate-side-wall insulating film and which contains nitrogen.

According to another aspect of the present invention, there is provided a method of manufacturing a semiconductor apparatus on which a MOS transistor having an elevated source and drain structure is formed, comprising the steps of:

forming a gate electrode on a silicon substrate through a gate insulating film;

forming a first insulating film on the overall surface to cover the gate insulating film and the gate electrode;

forming, on the first insulating film, a second insulating film made of a material which is different from the first insulating film;

etching the overall surface of the second insulating film by using the first insulating film to serve as an etching stopper so as to selectively leave the second insulating film on the side wall of the gate electrode;

removing the first insulating film in a region which is not covered with the second insulating film by etching and selectively leaving the first insulating film between the second insulating film and the silicon substrate;

epitaxial-growing silicon in a state in which the surface of the silicon substrate around the first and second insulating films is exposed to form, on the silicon substrate around the first and second insulating films, a silicon film free from any facet in a portion which is made contact with the second insulating film;

implanting ions of impurities into the surface of the silicon substrate through the silicon film and performing annealing to form a source diffusion layer and a drain diffusion layer on the surface of the silicon substrate; and converting at least the surface portion of the silicon film into a metal silicide film.

According to another aspect of the present invention, there is provided a semiconductor apparatus on which MOS transistor having an elevated source and drain structure is formed comprising:

a silicon substrate;

a gate electrode formed on the surface of the silicon substrate;

an elevated source film and an elevated drain film formed in a source region and a drain region of the surface of the silicon substrate and each having at least a surface made of a metal silicide film and conductivity such that the elevated source film and the elevated drain film are elevated over the surface of the substrate and the MOS transistor having a structure that the surfaces of the source region and the drain region are elevated over the surface of the silicon substrate owning to the formation of the elevated source film and the elevated drain film;

a first gate-side-wall insulating film formed on the side wall of a gate electrode of the MOS transistor; and a second gate-side-wall insulating film formed between the first gate-side-wall insulating film and the gate electrode and on the bottom surface of the first gate-side-wall insulating film, made of a material which is different from the first gate-side-wall insulating film and having the portion which is formed between the surface of the silicon substrate and the bottom of the first gate-side-wall insulating film and which exists in an inner bottom surface portion adjacent to the gate electrode.

According to another aspect of the present invention, there is provided a semiconductor apparatus on which MOS transistor having an elevated source and drain structure is formed comprising:

a silicon substrate;

a gate electrode formed on the surface of the silicon substrate through an insulating film;

an elevated source film and an elevated drain film formed in a source region and a drain region of the surface of the silicon substrate such that the elevated source film and the elevated drain film are elevated over the surface of the silicon substrate and the MOS transistor having a structure that the surfaces of the source region and the drain region are elevated over the surface of the silicon substrate owning to the formation of the elevated source film and the elevated drain film;

a gate-side-wall insulating film formed on the side wall of the gate electrode and having a bottom surface, a portion of which is apart from the surface of the silicon substrate;

a liner layer partially formed on the bottom surface of the gate-side-wall insulating film and the surface of the silicon substrate; and a gate insulating film formed between the bottom of the gate electrode and the surface of the silicon substrate and on the inner surface of the gate-side-wall insulating film.

According to another aspect of the present invention, there is provided a method of manufacturing a semiconductor apparatus on which a MOS transistor having an elevated source and drain structure is formed comprising the steps of:

forming a dummy gate electrode on a silicon substrate through a buffer oxide film;

implanting ions to the silicon substrate by using the dummy gate electrode as a mask;

forming a liner layer (SiO$_2$) on the overall surface to cover the buffer oxide film and the dummy gate electrode;

forming a first insulating film on the liner layer;

etching the overall surface of the SiN layer to selectively leave the first insulating film on the side wall of the gate electrode through the liner layer so as to form a SiN-gate side wall;

etching the liner layer in a region which is not covered with the first insulating film to remove the liner layer in the region and leaving the liner layer between the lower bottom of the side wall of the first insulating film and the silicon substrate;

epitaxially growing silicon in a state in which the surface of the silicon substrate around the liner layer and the side wall of the first insulating is exposed to form a silicon film on the silicon substrate around the liner layer and the side wall of the first insulating film;

implanting ions of impurities into the surface of the silicon substrate through the silicon film and performing annealing to form a source diffusion layer and a drain diffusion layer on the surface of the silicon substrate;

depositing an interlayer insulating film on the dummy gate electrode, the liner layer and the side wall of the first insulating film and flattening the surface of the interlayer insulating film so as to expose the surface of the dummy gate electrode;

removing the dummy gate electrode and the buffer oxide film so as to expose the surface of the silicon substrate;

forming a gate insulating film on the exposed surface of the silicon substrate and the inner surface of the side wall of the first insulating film; and embedding a gate electrode having a flattened upper surface in a groove formed on the surface of the silicon substrate and surrounded by the gate insulating film.

As a result of the above-mentioned structure, the semiconductor apparatus on which the MOS transistor having the elevated source and drain structure is formed and a manufacturing method therefor are able to form silicon films in the form of elevated films (conductive films each having at least the surface portion formed into the silicide film) which are free from any facet at the portion made contact with the second gate-side-wall insulating film. When ions of impurities are implanted into the surface of the silicon substrate through the silicon films, a MOS transistor having the source diffusion layer and the drain diffusion layer free from a deep joint can be manufactured.

The method of manufacturing a semiconductor apparatus on which the damascene gate transistor having the elevated source and drain structure is formed is able to form the gate insulating film after completion of the processes including implantation of ions into the source and drain, annealing and the Si epitaxial growth which are performed at high temperatures of about 700° C. or higher. A high-temperature process is not required after the process for forming the gate insulating film has been completed. Therefore, a ferroelectric film made of Ta205 or BST having physical properties which are changed in a high-temperature process may be employed as the gate insulating film exhibiting excellent characteristics.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a microphotograph showing a precise pattern formed on a substrate corresponding to the elevated source film and elevated drain film of the conventional MOS transistor having the elevated source and drain structure;

FIG. 8 is a microphotograph showing a precise pattern formed on a substrate corresponding to the elevated source film and elevated drain film of the MOS transistor having the elevated source and drain structure according to the present invention; and FIGS. 9A to 9I are cross sectional views showing the steps of a method of manufacturing a damascene gate transistor having the elevated source and drain structure according to a third embodiment of the present invention.

DETAILED DESCRIPTION OF THE INVENTION

Initially, the outline of the present invention will now be described with reference to FIGS. 3A to 3D prior to describing the embodiments of the present invention.

FIGS. 3A to 3D are cross sectional views showing the steps of the growth of an elevated source film and elevated drain film of a MOS transistor having the elevated source and drain structure.

Inventors of the present invention have found a fact that facets of the MOS transistor having the elevated source and drain structure were formed in the interface with a $SiO_2$ film, such as a gate edge or a STI (Shallow Trench Isolation) edge.

Figure 1:
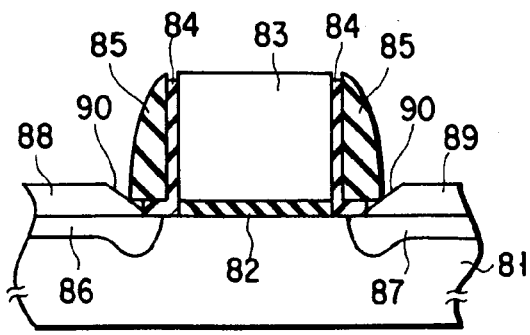
FIG. 1 is a cross sectional view showing a conventional MOS transistor having the elevated source and drain structure.
Figure 2:
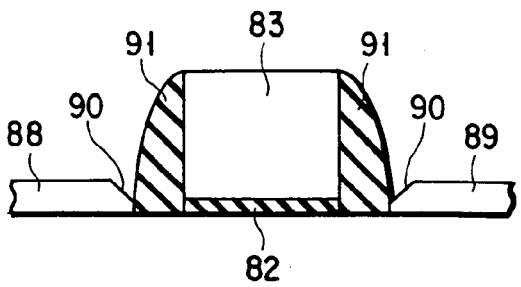
FIG. 2 is a cross sectional view showing a conventional MOS transistor having the elevated source and drain structure arranged such that SiO$_2$ is employed as the material of the gate-side-wall insulating film.

When a usual $SiO_2$ is employed as the material of the gate-side-wall insulating film, an elevated source film 88 and an elevated drain film 89 (epitaxial silicon layer) encounter formation of facets 90 in the form of crystal plane {311} at positions which are in contact with a gate-side-wall $SiO_2$ film 91 (gate edges), as shown in FIG. 2.

Figure 3A:
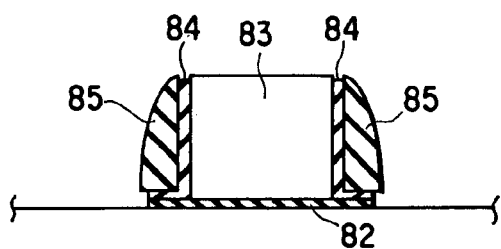
FIGS. 3A to 3D are cross sectional views showing a process of growth of the elevated source film and elevated drain film of the conventional MOS transistor having the elevated source and drain structure so as to describe formation of facets.

For example, as shown in FIG. 3A, selective epitaxial growth of silicon is performed in a state in which a gate-side-wall SiN film 85 has been formed on the side wall of a gate electrode 83 through a $SiO_2$ liner 84 and the surface of the substrate in the source region and the drain region has been exposed.

Figure 3B:
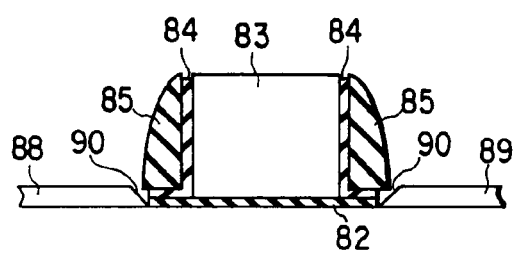

Thus, as shown in FIG. 3B, initially, the elevated source film 88 and the elevated drain film 89 (the epitaxial silicon film) are grown along the gate oxide film 82 (the $SiO_2$ film).

Then, the growth proceeds along the $SiO_2$ liner 84. Therefore, substantially the same result is yielded as a case in which the epitaxial grow proceeds along the edges of the $SiO_2$ film composed of the edges of the gate oxide film 82 and the $SiO_2$ liner 84. Thus, the facets 90 in the form of crystal plane {311} are undesirably formed at the lower ends of the gate edges.

Figure 3C:
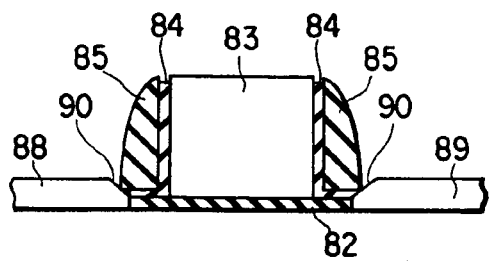

When the epitaxial growth of silicon is continued while the state shown in FIG. 3B is maintained, as shown in FIG. 3C, the surfaces of the facets 90 are brought into contact with the ends of the bottom surface of the gate-side-wall SiN film 85. Thus, a portion of the surfaces of the facets 90 are exposed to the outside of the gate-side-wall SiN film 85.

FIG. 4 is a microphotograph (a SEM image) showing a result of an experiment for confirming the foregoing fact.

The foregoing microphotograph shows a process (corresponding to the state shown in FIG. 3B) in which silicon has been epitaxially grown on a pattern of SiN film (having a thickness of 240 nm)/$SiO_2$ film (having a thickness of 50 nm). Then, the epitaxial growth of silicon has been continued.

As can be understood from FIGS. 3 and 4, the surfaces of the facets are always exposed during the epitaxial growth. Therefore, epitaxial growth of silicon proceeds without disappearance of the facets 90.

Figure 3D:
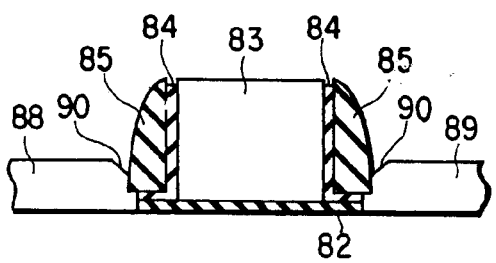

As a result, as shown in FIG. 3D, the elevated source film 88 and the elevated drain film 89 each having the facets 90 at the lower end of the gate edge are formed.

To prevent formation of the facets 90 at the gate edges as shown in FIGS. 3A to 3D, the present invention is structured such that the material of the gate-side-wall SiN film 85 and the shape (the structure) of the gate-side-wall SiN film 85 at the lower end of the edge are devised. Thus, the facets can be prevented.

Referring to the drawings, a first embodiment of the present invention will now be described.

The characteristics of the materials will now be described. In this invention, the material of the gate-side-wall SiN film is an insulating material containing nitrogen, the material being exemplified by silicon nitride (SiN) or nitride-oxide silicon (SiON).

The reason for this lies in that the inventors of the present invention have found a fact that formation of a facet can be prevented when the thickness of each of the elevated source film and the elevated drain film (the epitaxial silicon films) is about 100 nm or smaller in the case where the foregoing insulating material is employed.

The characteristics of the shape (the structure) will now be described.

A structure in which the gate-side-wall insulating film (the gate-side-wall SiN film) is made of SiN will now be described.

Initially, a $SiO_2$ liner 84 formed on the silicon substrate at a position below the gate-side-wall SiN film 85 is removed by etching performed in a lateral direction by using dilute hydrofluoric acid solution.

Figure 5:
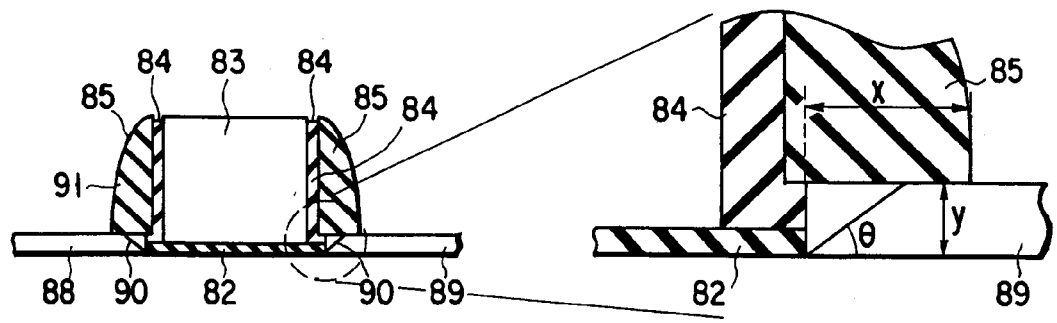
FIG. 5 is a cross sectional view showing a MOS transistor having the elevated source and drain structure according to the present invention and its enlarged portion.

Then, the selective epitaxial growth of the silicon layer on the silicon substrate is performed. Thus, the upper ends of the facets 90 formed in contact with the $SiO_2$ liner 84 are brought into contact with the bottom surface of the gate-side-wall SiN film 85, as shown in FIG. 5.

Therefore, the surfaces of the facets 90 are hidden in the bottom surface of the gate-side-wall SiN film 85, that is, the surfaces of the facets 90 do not expose to the outside of the gate-side-wall SiN film 85. Thus, the growth of the facets 90 can be prevented in the following growth process.

An assumption is made that the angle of the facets 90 formed in the foregoing case is θ. The following relationship must be satisfied:

$$\text{(distance y between the bottom surface of the gate-side-wall SiN film and the silicon substrate)} / \text{(amount x of lateral etching x)} < \tan\theta \quad \text{(Equation 1)}$$

To satisfy the foregoing equation (1), the amount x of the lateral etching, that is, the length of the portion is controlled in which the $SiO_2$ liner 84 is not formed in the direction of the length of the channel of the bottom surface of the gate-side-wall SiN film 85. Thus, the structure shown in FIG. 5 can be obtained. The value of θ can be obtained from the detected crystal plane of the formed facet.

When silicon is grown by a vapor phase epitaxial method on a pattern formed on a {100} wafer used in a usual semiconductor process in a direction <110>, formation of plane {311} as the facet is given priority in the pattern edge. Therefore, the angel θ must be 25.23°.

If the surface of the foregoing facet is a composite plane of the plane {311} and a plane steeper than the plane {311}, an assumption is made that only the plane {311} is formed in a case where the surface of another facet has a facet angle (which is θ defined as described above) steeper than the plane {311}. Therefore, the amount x of lateral etching and the thickness y of the $SiO_2$ liner must be decided in accordance with equation (1).

Thus, an epitaxial silicon layer free from a facet can be formed at the lower end of the gate-side-wall SiN film 85.

FIG. 8 shows a microphotograph (a cross SEM image) showing a fact that no facet is formed in a portion made contact with the SiN film if equation (1) is satisfied. An experiment material has been employed in which silicon has been epitaxially grown on a pattern of SiN film (having a thickness of 240 nm)/SiO$_2$ film (having a thickness of 50 nm).

When SiON having the same characteristics as those of SiN is employed as the material of the liner, formation of a facet can be prevented without a necessity of controlling the shape (controlling of parameters x, y and θ) of the bottom portion of the gate-side-wall SiN film by performing the lateral etching of the SiO$_2$ liner.

Therefore, the necessity of paying attention to the shape of the bottom portion of the gate-side-wall SiN film 85 can be eliminated in the foregoing case.

A first embodiment of the present invention will now be described with reference to FIGS. 6A to 6K.

FIGS. 6A to 6K are cross sectional views showing the steps of a method of manufacturing the MOS transistor having the elevated source and drain structure according to the first embodiment of the present invention.

Figure 6A:
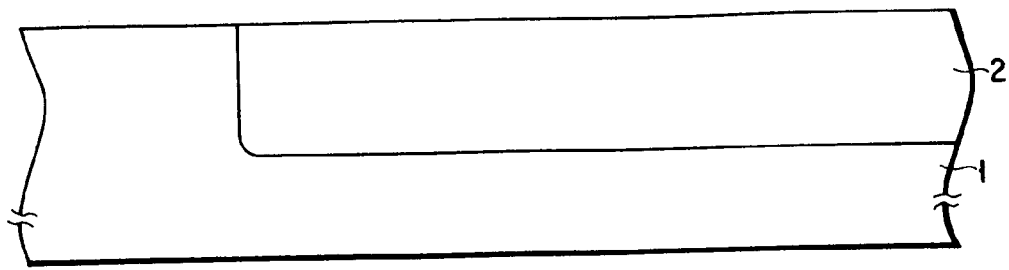
FIGS. 6A to 6K are cross sectional views showing the steps of manufacturing the MOS transistor having the elevated source and drain structure according to a first embodiment of the present invention.

As shown in FIG. 6A, As (arsenic) ions are implanted into the surface of a silicon substrate 1 having a main surface which is {100}. Then, annealing is performed so that an n-type well 2 having a depth of about 1 μm is formed.

Figure 6B:
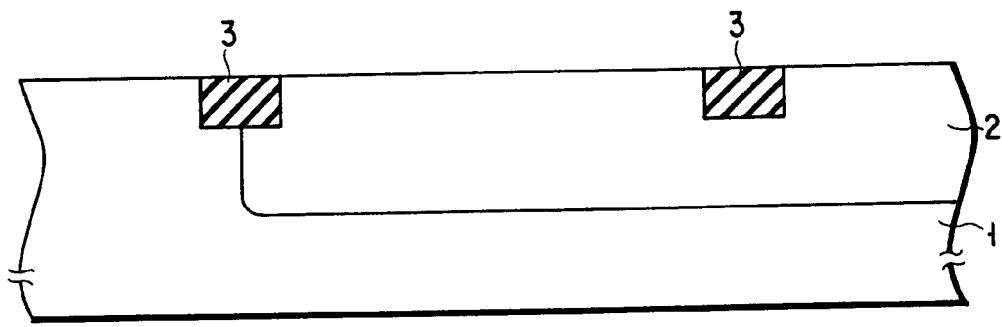

Then, as shown in FIG. 6B, a shallow trench is formed in the surface of the silicon substrate 1, and then an oxide film 3 is embedded in the inside portion of the trench. Thus, STI (Silicon Trench Isolation) is performed to form a device isolation region which defines a region in which the MOS transistor will be formed. The thickness (the depth of the trench) of the oxide film 3 is, for example, about 600 nm.

Figure 6C:
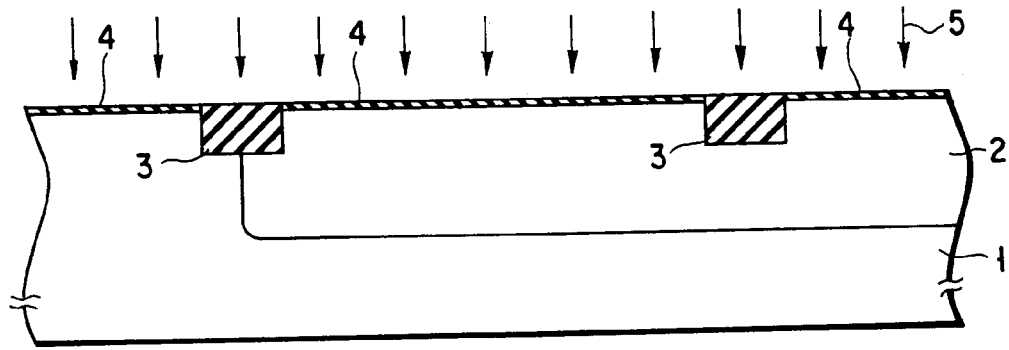

Then, as shown in FIG. 6C, a protective oxide film 4 having a thickness of about 10 nm is formed on the surface of the silicon substrate 1 by, for example, thermal oxidation. Then, the threshold voltage of the MOS transistor is adjusted by implanting impurity ions 5 into the surface region of the silicon substrate 1 through the protective oxide film 4. Then, the protective oxide film 4 is separated.

Figure 6D:
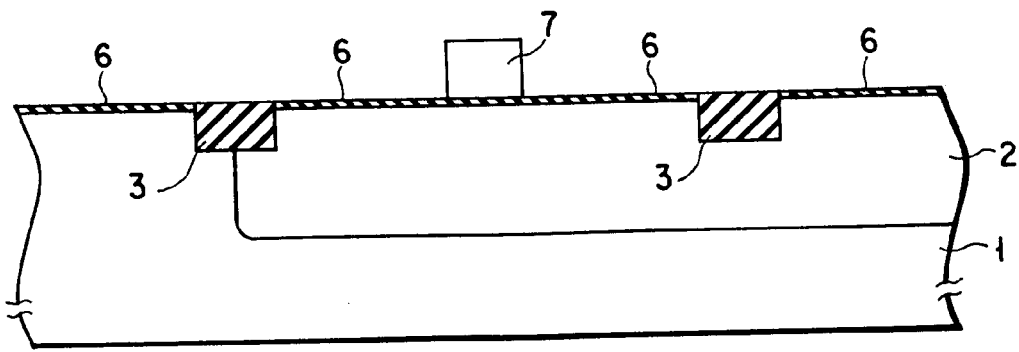

Then, as shown in FIG. 6D, a gate oxide film 6 having a thickness of about several nm is formed by thermal oxidation. Then, a gate electrode 7 made of polycrystal silicon is formed on the gate oxide film 6. The selected longitudinal direction of the gate electrode 7 is the direction <110> of the silicon substrate 1.

A specific method of forming the gate electrode 7 will now be described. That is, a polycrystal silicon film which has a thickness of 200 nm and which will be formed into the gate electrode 7 is deposited on the gate oxide film 6 by a CVD method or the like. Then, a photoresist pattern is formed on the polycrystal silicon film which is used as a mask in a process for etching the polycrystal silicon film. Thus, the gate electrode 7 is formed.

Figure 6E:
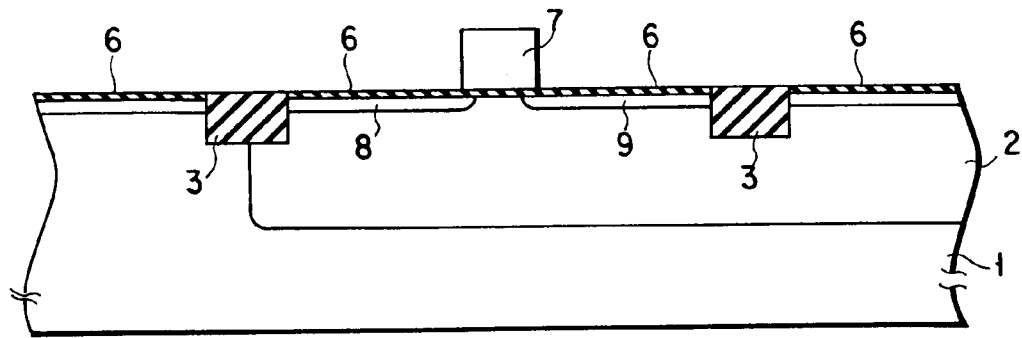

Then, as shown in FIG. 6E, the gate electrode 7 is used as a mask for a process for implanting ions of impurities into the surface of the silicon substrate 1. Then, annealing is performed so that shallow source diffusion layer 8 and drain diffusion layer (LDD) 9 each contains impurities at a low concentration are formed in a self-aligning manner.

The implantation of ions is performed under conditions that the accelerated voltage is 10 KeV and the dose is 5×10$^{14}$ cm$^{-2}$ in a case where BF$_2$ ions are implanted.

Figure 6F:
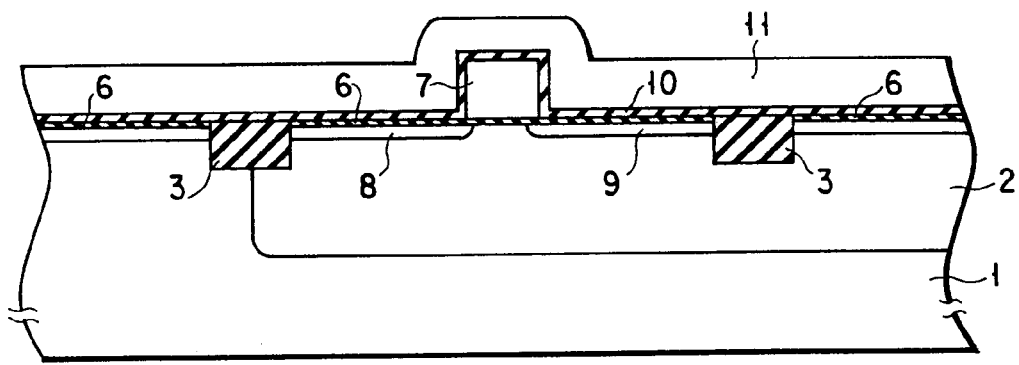

Then, as shown in FIG. 6F, a SiO$_2$ liner 10 made of SiO$_2$ and having a thickness of 10 nm is deposited on the overall surface by a LPCVD method. Then, a silicon nitride film 11 having a thickness of about 70 nm is deposited on the SiO$_2$ liner 10 by a LPCVD method with satisfactory covering power.

Since the SiO$_2$ liner 10 will be employed as an etching stopper in a latter process, the SiO$_2$ liner 10 must have thickness of about 10 nm or greater.

Figure 6G:
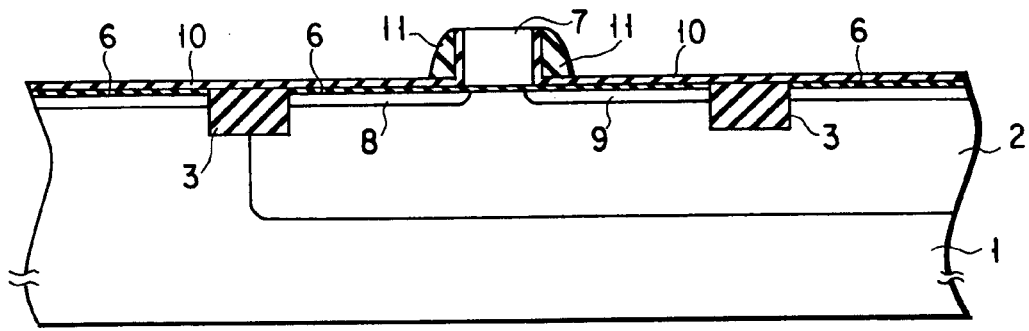

Then, as shown in FIG. 6G, the SiO$_2$ liner 10 is employed as the etching stopper with respect to the silicon substrate 1 in a process for etching the overall surface of the silicon nitride film 11 by a RIE method. Thus, the silicon nitride film 11 is selectively left on the side wall of the gate electrode 7 through the SiO$_2$ liner 10. Then, the left silicon nitride film 11 is called a gate-side-wall SiN film 11.

In this embodiment, etching is performed such that the demise of the SiO$_2$ liner 10 is prevented. If the demise of the gate oxide film 6 which is the ground for the SiO$_2$ liner 10 can be prevented, the demise of the SiO$_2$ liner 10 is permitted.

The foregoing etching process can easily be performed because the gate oxide film 6 (the thermally oxidized film) is a film denser than the SiO$_2$ liner 10 (the LPCVD film).

Figure 6H:
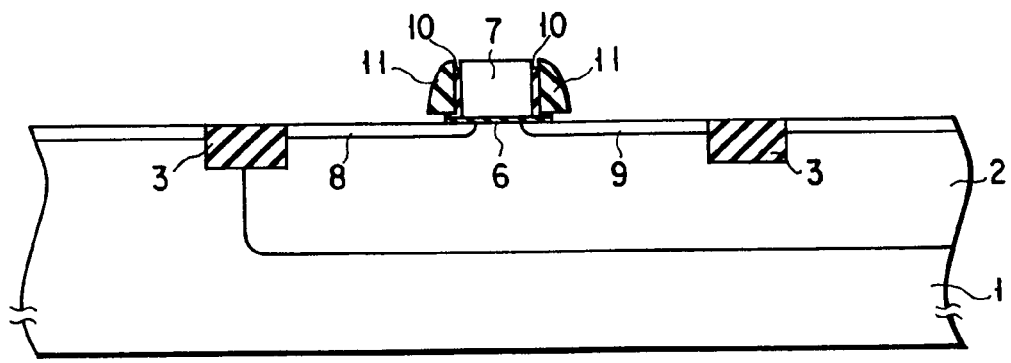

Then, as shown in FIG. 6H, a wet etching process (an isotropic etching process) using dilute hydrofluoric acid solution is performed to remove the SiO$_2$ liner 10 and the gate oxide film 6 in the regions which are not covered with the gate-side-wall SiN film 11. Moreover, the SiO$_2$ liner 10 and the gate oxide film 6 on the bottom surface of the gate-side-wall SiN film 11 are etched in the lateral direction. Thus, the SiO$_2$ liner 10 and the gate oxide film 6 are selectively left in the portions inner than the gate-side-wall SiN film 11.

At this time, the angle θ of the facet defined in the description performed with reference to FIG. 5 is made to be 23.5° in order to prevent formation of the {311} facet which occurs when the silicon substrate 1 having the main surface which is {100} is employed during the epitaxial growth of silicon which is performed later.

The distance y defined with reference to FIG. 5 corresponds to total thickness d of the SiO$_2$ liner 10 and the gate oxide film 6. Therefore, etching is performed such that amount x [nm] in the lateral direction with respect to the thickness of each of the SiO$_2$ liner 10 and the gate oxide film 6 satisfies d/x<tan 25.3°.

In this embodiment, the thickness of the SiO$_2$ liner 10 is 10 nm and that of the gate oxide film 6 is several nm. When the thickness of the gate oxide film 6 is not greater than 3 nm, d=13 is obtained. Therefore, the relationship x>27.5 must be satisfied.

Since the SiO$_2$ liner 10 and the gate oxide film 6 are etched by predetermined quantities in the lateral direction, a gap having a predetermined size is formed between the bottom surfaces of the gate-side-wall SiN film 11 and the silicon substrate 1.

Figure 6I:
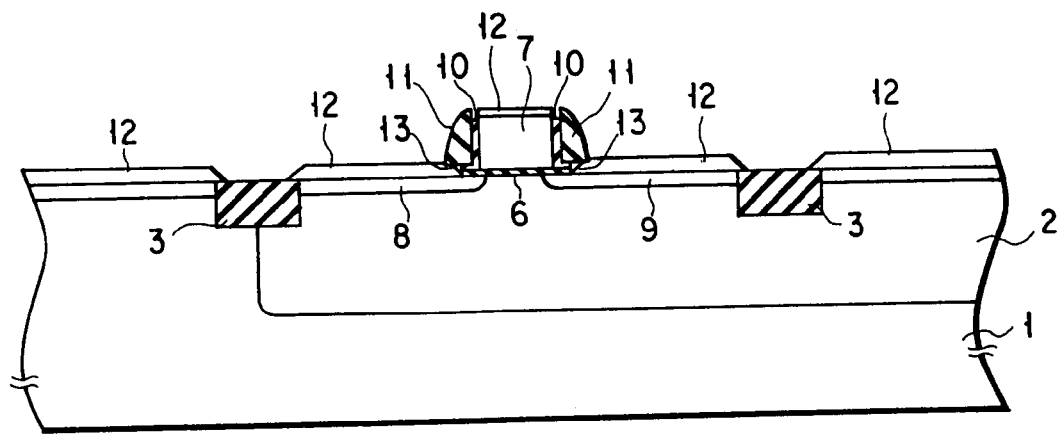

Then, as shown in FIG. 6I, a vapor phase epitaxial growth method is employed to form an epitaxial silicon film (a single crystal silicon film) 12 having a thickness of about 50 nm on the source diffusion layer 8 and the drain diffusion layer 9 allowed to appear after the SiO$_2$ liner 10 and the gate oxide film 6 have been removed.

The epitaxial silicon film 12 is formed by a raw-material gas which is prepared by diluting mixed gas of, for example, SiH$_2$Cl$_2$ gas and HCl gas with H$_2$ gas. The pressure must be a low level in the 10 Torr range. Note that the raw-material gas may be composed of SiH$_4$ gas.

The epitaxial silicon film 12 is brought into contact with the SiO$_2$ liner 10 in an initial stage of the growth in which the thickness of the epitaxial silicon film 12 is smaller than 10 nm. Therefore, facets 13 of the plane {311} are formed.

When the thickness is larger than 10 nm because of the growth of the epitaxial silicon film 12, the facets 13 are hidden in the bottom surface of the gate-side-wall SiN liner 10. Thus, epitaxial silicon is grown such that the epitaxial silicon is being made contact with the side surface of the gate-side-wall SiN film 11.

Therefore, the epitaxial silicon film 12 in a state of the growth in which the thickness of the epitaxial silicon film 12 is larger than 10 nm is free from formation of a facet at the lower end of the gate edge.

To prevent a facet, the thickness of the epitaxial silicon film 12 from the gate-side-wall SiN film 11 must be smaller than 100 nm. If the thickness is 100 nm or greater, even epitaxial growth along the SiN film results in formation of a facet.

Also the epitaxial silicon film 12 is formed on the gate electrode 7. The polycrystal silicon film on the gate electrode 7 is not formed into a single crystal silicon film like the epitaxial silicon film 12 on the source diffusion layer 8 and the drain diffusion layer 9 because the gate electrode 7 which is the ground of the polycrystal silicon film on the gate electrode 7 is a polycrystal silicon film.

Although the drawing shows a state in which the epitaxial silicon film 12 is grown as well as on the oxide film 3 which is a device isolating insulating film, growth of the same on the oxide film 3 may be inhibited.

Figure 6J:
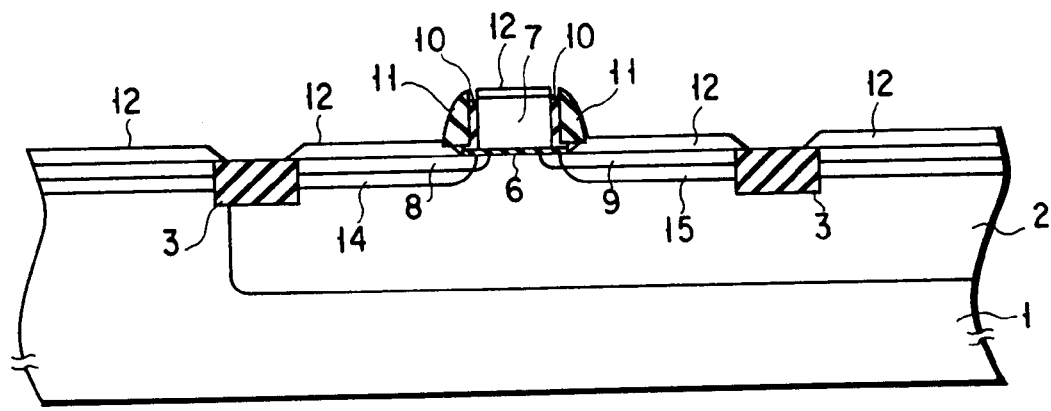

Then, as shown in FIG. 6J, the gate electrode 7 and the gate-side-wall SiN film 11 are used as masks in a process for implanting ions of impurities into the surface of the silicon substrate 1. Then, annealing is performed to, in a self-aligning manner, form deep source diffusion layer 14 and drain diffusion layer 15 each containing impurities at a higher concentration as compared with the concentration of each of the source diffusion layer 8 and the drain diffusion layer 9. When $BF_2$ ions are implanted, the accelerated voltage is 40 Kev and the dose is $3 \times 10^{15}$ cm$^{-2}$.

The portion of the epitaxial silicon film 12 which is in contact with the gate-side-wall SiN film 11 is free from a facet. Therefore, formation to a deep source diffusion layer 14 and a deep drain diffusion layer 15 each containing impurities at a high concentration which causes the short-channel effect and the joint leak current can be prevented at the gate edges.

Figure 6K:
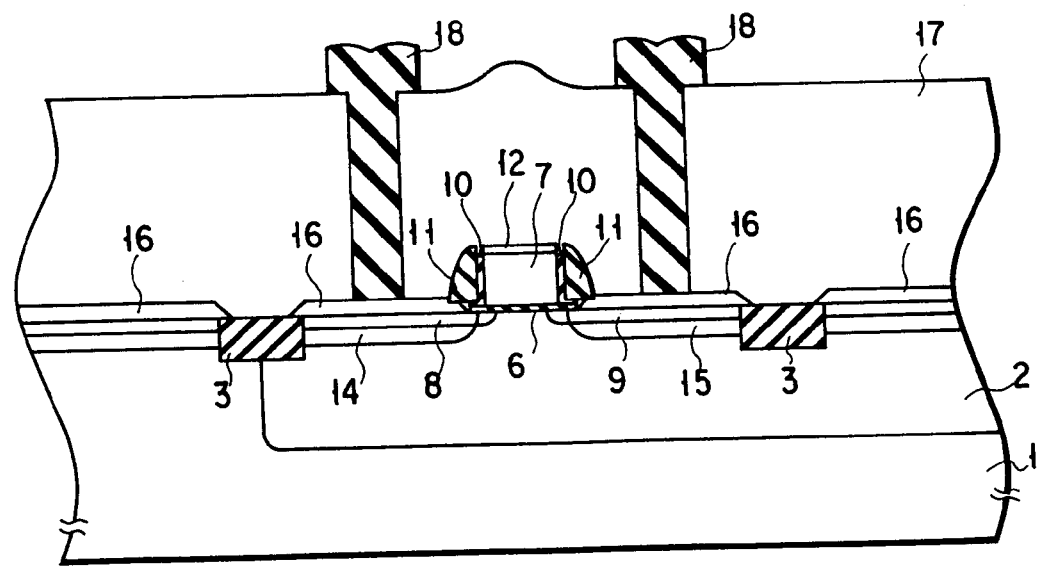

Then, as shown in FIG. 6K, a usual silicide technique is employed to form a metal silicide film 16 in a self-aligning manner, and then an interlayer insulating film 17 is deposited on the overall surface.

Finally, a contact hole is formed in the interlayer insulating film 17, and then an Al circuit (a source electrode and a drain electrode) 18 is formed. Thus, the MOS transistor having the elevated source and drain structure is manufactured.

In this embodiment, the overall body of the epitaxial silicon film 12 is formed into the silicide structure to form the metal silicide film 16. Note that only the upper portion of the epitaxial silicon film 12 may be converted into the metal silicide film 16.

As described above, according to this embodiment, the $SiO_2$ liner 10 is employed as the liner, the gate-side-wall SiN film 11 is employed as the gate-side-wall insulating film, and the $SiO_2$ liner 10 on the bottom surface of the gate-side-wall SiN film 11 is removed in a predetermined quantity in the lateral direction to form a gap having a predetermined size in a portion between the bottom surface of the gate-side-wall SiN film 11 and the silicon substrate 1. Then, silicon is epitaxial-grown. Thus, the epitaxial silicon film 12 free from a facet can be formed in a portion which is made contact with the gate-side-wall SiN film 11.

Then, ions of impurities are implanted into the surface of the silicon substrate 1 through the epitaxial silicon film 12 free from a facet to form the source diffusion layer 14 and the drain diffusion layer 15. As a result, formation of deep diffusion layers each containing impurities at a high concentration and causing the short-channel effect and the joint leak current can be prevented at the gate edges. Therefore, a precise MOS transistor free from the problems of the short-channel effect and the joint leak current can be manufactured.

A second embodiment of the semiconductor apparatus having the elevated source and drain structure and a manufacturing method therefor according to the present invention will now be described.

Figure 7A:
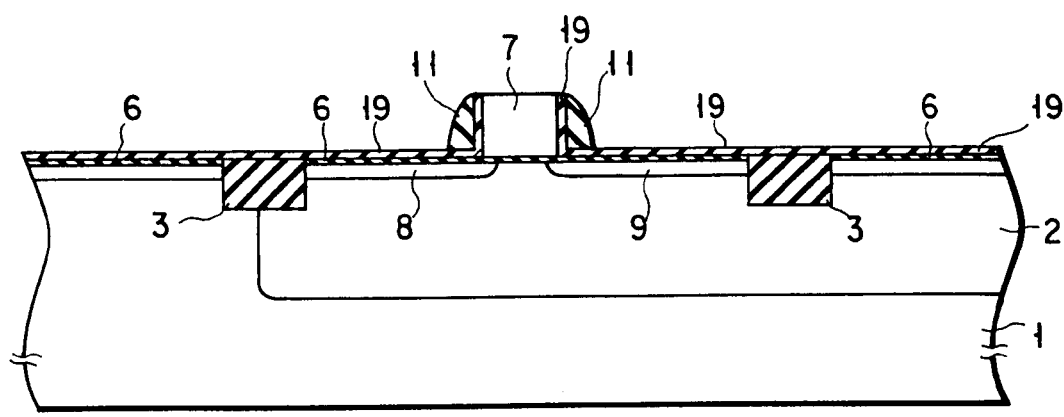
FIGS. 7A to 7C are cross sectional views showing the steps of manufacturing the MOS transistor having the elevated source and drain structure according to a second embodiment of the present invention.
Figure 7B:
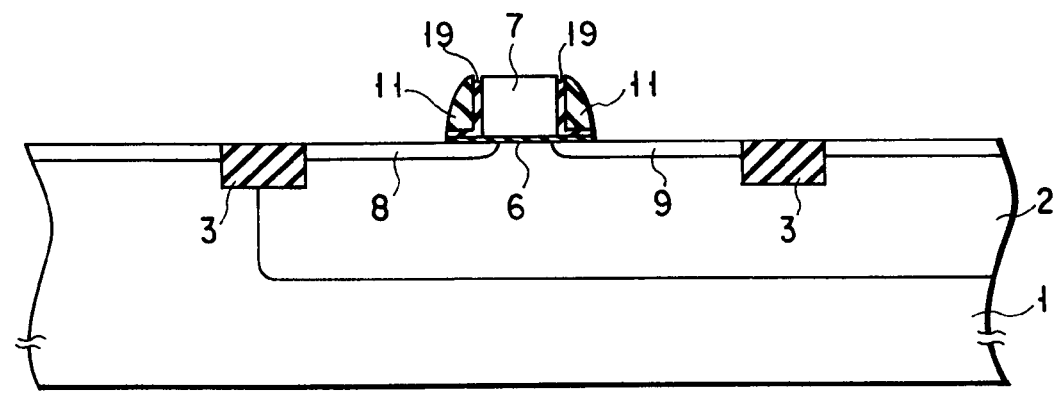
Figure 7C:
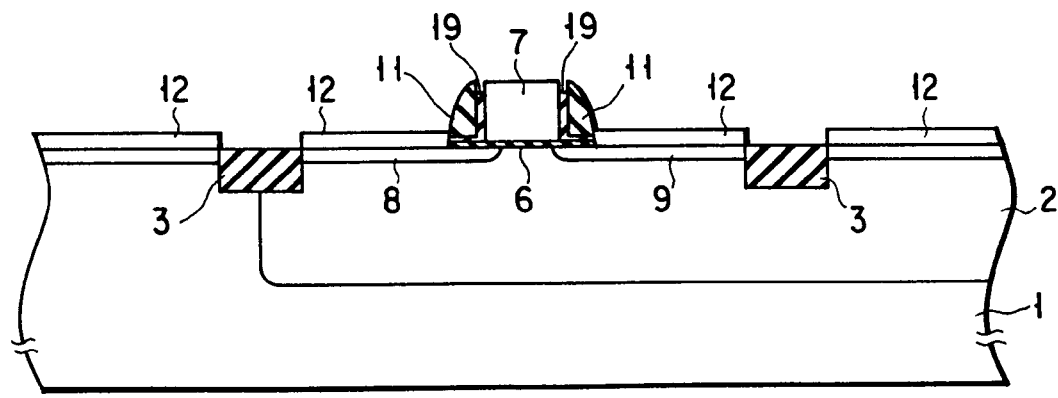

FIGS. 7A to 7C are cross sectional views showing the steps of a method of manufacturing a MOS transistor having the elevated source and drain structure.

Portions corresponding to those shown in FIGS. 6A to 6K are given the same reference numerals and the corresponding portions are omitted from description.

The second embodiment is different from the first embodiment in the SiON liner 19 employed in place of the SiN liner 10.

The cross sectional view showing the step shown in FIG. 7A is the same as the cross sectional view showing a state after the steps shown in FIGS. 6A to 6G according to the first embodiment have been performed, and the same as the first embodiment except in that the SiON liner 19 is employed.

Then, as shown in FIG. 7B, portions of the $SiO_2$ liner 19 and the gate oxide film 6 which are not covered with the gate-side-wall SiN film 11 are removed. At this time, the SiON liner 19 is not required to be etched in the lateral direction.

Then, as shown in FIG. 7C, a vapor phase selective epitaxial growth method is employed to form the epitaxial silicon film 12 having a thickness of about 50 nm on the source diffusion layer 8 and the drain diffusion layer 9.

Since SiON has similar characteristics as those of SiN in regard to epitaxial growth of silicon, that is, when the epitaxial silicon film 12 is grown while the epitaxial silicon film 12 is being in contact with the SiON film, the epitaxial silicon film 12 is grown flat similarly to the case in which the epitaxial silicon film 12 is grown while the epitaxial silicon film 12 is being in contact with the SiN film.

Therefore, if the SiON liner 19 is not etched in the lateral direction, the epitaxial silicon layer 11 free from a facet can be formed, as shown in FIG. 7C.

The following steps are the same as those shown in FIG. 6K showing the first embodiment. Also the second embodiment attains a similar effect obtainable from the first embodiment.

FIGS. 9A to 9K show a third embodiment of a damascene gate transistor according to the present invention.

A STI (Shallow Trench Isolation) process is performed by a known procedure to form a device region on a semiconductor substrate made of silicon (not shown). A silicon nitride film serving as a mask is deposited on, for example, a silicon substrate through a buffer oxide film. Then, a resist for transcription is patterned, and then RIE, that is, reactive ion etching, is performed so that a pattern of the device region is formed on the silicon nitride film. Then, the resist is removed, and then the silicon nitride film is used as a mask in a process for etching the silicon substrate in a device isolation region. Then, an insulating film, such as a silicon oxide film, is deposited in the device isolation region. Then, CMP (Chemical Mechanical Polishing) is performed to flatten the upper surface of the silicon nitride film which is the mask. Then, the silicon nitride film and the buffer oxide film are removed so that the device region and the device isolation region are formed. If necessary, impurities are implanted into the overall surface of the transistor region so that the concentration of the impurities in the channel portion of the transistor is adjusted.

As shown in FIG. 9A, a buffer oxide film 21 is formed on the substrate 20, and then amorphous or polycrystal silicon 22 and a silicon nitride film 23 are sequentially deposited. A resist is applied, and then the pattern of a gate is transferred to a portion in which the gate electrode must be formed. The pattern of the gate is used as a mask in a process for performing anisotropic etching of the silicon nitride film and the polycrystal silicon film so that a dummy gate 24 is formed.

Then, for example, BF2 gas is used to implant boron ions under conditions of 10 KeV and $5 \times 10^{14}$ cm$^{-2}$ by using the dummy gate 24 as a mask. Thus, region called LDD (Lightly Doped Drain) which will be formed into portions of the source region and the drain region are formed. Then, a LP-CVD method is employed to deposit SiO$_2$ having a thickness of about 10 nm or oxidize the same so that a liner layer 25 is formed. Then, the LP-CVD method or the like is employed to deposit a SiN layer having a thickness of about 70 nm with satisfactory covering power with respect to the liner layer. Then, RIE is performed to leave SiN on only the gate side wall so that a gate side wall 26 is formed. The foregoing oxide-film liner layer 25 serves as an etching stopper when SiN is subjected to the RIE:

When SiN is completely etched such that only the gate side wall 26 is left as shown in FIG. 9A, also the SiO$_2$ layer which is the liner layer 25 is sometimes somewhat etched. If the liner layer 25 is left, the Si substrate 20 can be protected from the RIE. Therefore, no damage takes place.

Then, selective epitaxial growth of Si is performed. To perform the epitaxial growth, the crystallinity of the substrate must be continued to the epitaxial layer. Thus, SiO$_2$ left on the source and drain regions must be removed. Therefore, an etching process using dilute hydrofluoric acid or the like is performed before the epitaxial growth so that SiO$_2$ on the source and drain is previously removed. The isotropic etching, such as the wet process using the dilute hydrofluoric acid, etches also the oxide film in the bottom portion of the SiN side wall as well as the naturally oxidized films on the source and drain (see FIG. 9B).

In this embodiment, formation of {311} facets is prevented in a case where the {100} substrate is employed by making the angle θ defined in FIG. 5 to be 23.5°. The distance y defined in FIG. 5 corresponds to the thickness of the SiO$_2$ liner 25 according to this embodiment. Therefore, etching is performed such that amount x of lateral etching per a thickness of 10 nm of the liner must satisfy x >21 nm in accordance with 10/x<tan 25.3°. Then, a vapor phase selective epitaxial growth method is employed to selectively form an epitaxial Si layer 27 having a thickness of about 50 nm in the source and drain regions. In this embodiment shown in FIG. 9C, a mixed gas prepared by diluting SiH$_2$Cl$_2$/HCl with H$_2$ is employed to perform the epitaxial growth in a low-pressure atmosphere in the 10 Torr range. If SiH$_4$ or the like is employed, the present invention can satisfactorily be performed. In an initial state of the growth in which the epitaxial Si has a thickness not larger than 10 nm, the epitaxial Si layer 27 is made contact with the SION liner layer 25. Thus, facets 28 on the {311} plane are formed. The facets 28 are hidden in the bottom portion of the SiN side wall 26 when the thickness is larger than 10 nm. Therefore, the epitaxial Si layer 27 in the portion made contact with the SiN side wall is free from any facet when the epitaxial Si layer 27 has a thickness not smaller than 10 nm.

Then, for example, BF2 gas is employed to implant boron ions into the epitaxial Si layer 27 under conditions of 40 KeV and $3 \times 10^{15}$ cm$^{-2}$ by using the dummy gate 24 and the SiN side wall 26 to serve as masks. After the process for implanting ions has been completed, annealing is performed so that a source diffusion layer and a drain diffusion layer serving as the high-concentration diffusion layers are formed on the silicon substrate. Note that silicide may be formed on the upper surface of the epitaxial Si layer 27 to lower the resistance of the source and drain diffusion layers. In the foregoing case, a process for forming silicide may be performed before the process for implanting ions into the diffusion layers is performed. According to the present invention, the epitaxial Si layer free from a facet has selectively been formed on the source and the drain. Therefore, ions are not implanted deeper into the substrate between the SiN side wall and the epitaxial Si layer 27. Therefore, abnormal diffusion can be prevented and, thus, excellent characteristics free from a joint leak and deterioration in the pressure resistance between the source and the drain can be obtained.

Then, as shown in FIG. 9D, an interlayer insulating film 29, such as TEOS, is deposited on the overall surface. Then, CMP or the like is performed to flatten the interlayer insulating film 29. Moreover, the silicon nitride film on the upper surface of the dummy gate 24 is exposed. Then, as shown in FIG. 9E, a phosphoric acid process is performed to remove the silicon nitride film SiN 23. Then, CDE (Chemical Dry Etching) is performed so that polycrystal silicon 22 of the dummy gate 24 is removed. The silicon oxide film 21 formed to serve as the buffer is, by a dilute hydrofluoric acid process, removed from the groove portion from which the dummy gate 24 has been removed to expose the surface of the silicon substrate. FIG. 9G shows a partially-enlarged lower bottom of the side wall of the SiN layer. Then, as shown in FIG. 9F, the surface of the silicon substrate is oxidized or an insulating film (made of, for example, tantalum oxide) is deposited. Thus, a gate insulating film 31 is formed. If necessary, an interface layer 30, which is, for example, a nitride layer, may be formed from the silicon substrate. FIG. 9H shows a partially-enlarged view showing the lower bottom portion of the gate insulating film 31 and the SiN-layer side wall 26.

Figure 9I:
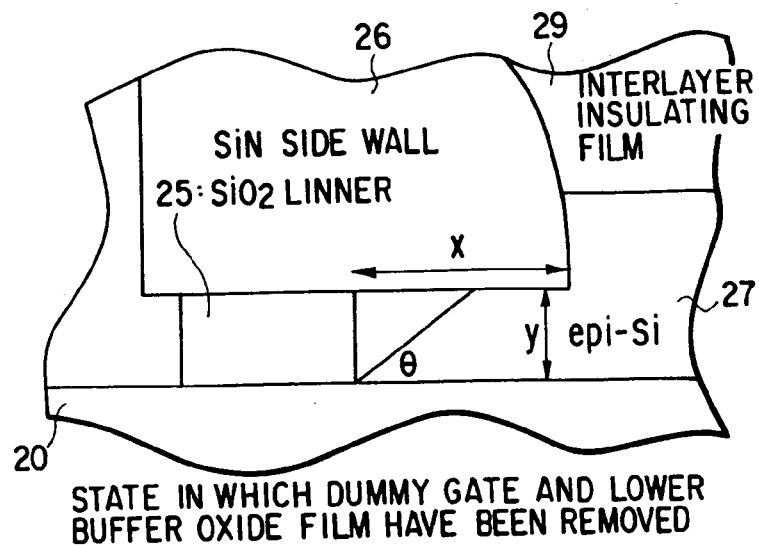
Figure 9I:
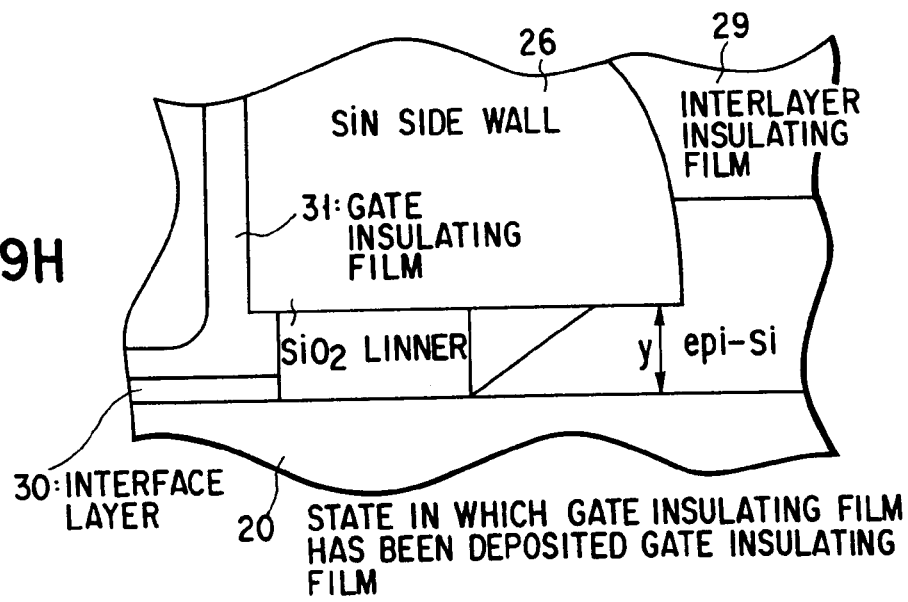
Figure 9I:
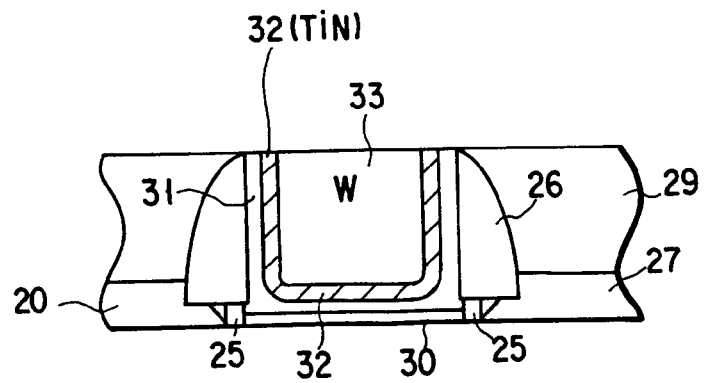

In this embodiment, as shown in FIG. 9I, when the material of the gate is tungsten which is a metal material, titanium nitride serving as a reaction preventive film 32 is formed. Then, tungsten is formed in the groove portion, and then CMP or the like is performed to flatten the surface. Thus, the gate tungsten electrode 33 is embedded in the groove. At this time, the upper surface has been flattened.

Note that the gate insulating film 31 is made of Ta2O5 having a higher dielectric constant than a silicon nitride film.

When SiN silicon nitride film 23 is removed after the process shown in FIG. 9D has been completed, the upper portion of the SiN side wall 26 exposes over the surface and also the SiN side wall is sometimes simultaneously etched. In the foregoing case, the gate electrode is embedded in the upper portion of the SiN side wall. Since the etched depth is limited to about the thickness of the SiN film in the foregoing case, excessive etching to make a contact with the epitaxial epi-Si 27 can be prevented. Therefore, short circuit caused from the gate electrode can be prevented. Therefore, increase in the leak currents between the gate and the source and between the gate and drain can be prevented.

Then, a usual process for forming a transistor is performed. That is, the interlayer insulating film is deposited on the overall surface, and then the gate contact hole is patterned. Then, anisotropic etching is performed so that the contact hole is formed. After titanium nitride serving as the material of the reaction preventive layer has been formed, aluminum serving as the gate electric line is formed. The gate electric line is transferred to the resist by performing patterning. Then, aluminum is removed by etching so that the gate electric line is formed.

According to the third embodiment of the method of manufacturing the damascene gate transistor according to the present invention, the gate insulating film 31 can be formed after the high-temperature processes have been completed which are performed at 700° C. or higher and which include implantation of ions into the source and drain, the annealing process and the Si epitaxial growth. Moreover, a high-temperature process which is performed at 500° C. is not required after the step for forming the gate insulating film 31 has been completed. Therefore, a film made of high dielectric material, such as Ta205 or BST, having the physical properties which are changed in a high-temperature process, may be employed as the gate insulating film. In this case, satisfactory characteristics can be obtained.

Similarly to the transistors manufactured by the methods according to the first embodiment and the second embodiment, the transistor manufactured by the manufacturing method according to the third embodiment of the present invention has the structure that a portion of the space between the epitaxial silicon layers, which are the source region and the drain region, and the gate electrode is formed into a cavity owning to the facets formed when the epitaxial silicon has been formed. Therefore, the capacity between the source and the gate and that between the source and the drain can be reduced. At this time, a portion of the liner layer 25 is left in the lower bottom of the SiN side wall 26.

The present invention is not limited to the foregoing embodiments, and various modifications are permitted without departing from the spirit of the present invention.

For example, an etch back process may be substituted for the CMP for flattening the interlayer film and the material of the gate. As for the gate portion, the CMP flattening process is not performed. In this case, the gate electrode is formed by patterning and etching processes. The material of the gate electrode is not limited to the tungsten. Other material such as aluminum or copper may be employed. The reaction preventive film may be made of tungsten nitride or tantalum nitride in place of the titanium nitride. If the electrode is not made of a metal material and the same is made of polycrystal silicon containing phosphor, the reaction preventive film is not required. The material of the gate insulating film is not limited to the tantalum oxide. Any insulating film having a high dielectric constant may be employed. When the dummy gate was removed, ions may be implanted across the buffer oxide film to adjust the local threshold value. The impurities, the ions of which are implanted to form the diffusion layers, are not limited to boron. The impurities may be phosphorus. When a p-type diffusion layer is formed, boron or BF2 may be employed. Note that the ion implanting conditions vary depending on the type of the ion.

Note that the present invention is not limited to the foregoing embodiments. Although a single MOS transistor has been described in each of the foregoing embodiments, the present invention may be applied to, for example, a CMOS transistor which is composed of MOS transistors having different conduction types of the channels.

Note that a variety of modifications are permitted without departing from the spirit of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor apparatus on which a MOS transistor having an elevated source and drain structure is formed, comprising the steps of:

forming a gate electrode on a silicon substrate through a gate insulating film;

forming a first insulating film on the overall surface to cover the gate insulating film and the gate electrode;

forming, on the first insulating film, a second insulating film made of a material which is different from the first insulating film;

etching the overall surface of the second insulating film by using the first insulating film to serve as an etching stopper so as to selectively leave the second insulating film on the side wall of the gate electrode;

removing the first insulating film in a region which is not covered with the second insulating film by etching and selectively leaving the first insulating film between the second insulating film and the silicon substrate;

epitaxial-growing silicon in a state in which the surface of the silicon substrate around the first and second insulating films is exposed to form, on the silicon substrate around the first and second insulating films, a silicon film free from any facet in, a portion which is made contact with the second insulating film;

implanting ions of impurities into the surface of the silicon substrate through the silicon film and performing annealing to form a source diffusion layer and a drain diffusion layer on the surface of the silicon substrate; and converting at least the surface portion of the silicon film into a metal silicide film.

2. A method of manufacturing a semiconductor apparatus according to claim 1, wherein the first insulating film is made of a silicon compound which does not contain nitrogen and the second insulating film is made of a silicon compound which contains nitrogen.

3. A method of manufacturing a semiconductor apparatus on which a MOS transistor having an elevated source and drain structure is formed comprising the steps of:

forming a dummy gate electrode on a silicon substrate through a buffer oxide film;

implanting ions to the silicon substrate by using the dummy gate electrode as a mask;

forming a liner layer (SiO$_2$) on the overall surface to cover the buffer oxide film and the dummy gate electrode;

forming a first insulating film on the liner layer;

etching the overall surface of the first insulating film to selectively leave the first insulating film on the side wall of the gate electrode through the liner layer so as to form a SiN-gate side wall;

etching the liner layer in a region which is not covered with the first insulating film to remove the liner layer in the region and leaving the liner layer between the lower bottom of the side wall of the first insulating film and the silicon substrate;

epitaxially growing silicon in a state in which the surface of the silicon substrate around the liner layer and the side wall of the first insulating film is exposed to form a silicon film on the silicon substrate around the liner layer and the side wall of the first insulating film;

implanting ions of impurities into the surface of the silicon substrate through the silicon film and performing annealing to form a source diffusion layer and a drain diffusion layer on the surface of the silicon substrate;

depositing an interlayer insulating film on the dummy gate electrode, the liner layer and the side wall of the first insulating film and flattening the surface of the interlayer insulating film so as to expose the surface of the dummy gate electrode;

removing the dummy gate electrode and the buffer oxide film so as to expose the surface of the silicon substrate;

forming a gate insulating film on the exposed surface of the silicon substrate and the inner surface of the side wall of the first insulating film; and embedding a gate electrode having a flattened upper surface in a groove formed on the surface of the silicon substrate and surrounded by the gate insulating film.

4. A method of manufacturing a semiconductor apparatus according to claim 3, wherein the gate electrode is made of a metal and further includes a step of interposing a reaction preventive film between the gate insulating film and the gate electrode on the exposed surface of the silicon substrate, the interposing step being performed prior to the step of embedding the gate electrode.

* * * * *

UNITED STATES PATENT AND TRADEMARK OFFICE
CERTIFICATE OF CORRECTION

PATENT NO. : 6,335,251 B2
DATED : January 1, 2002
INVENTOR(S) : Kiyotaka Miyano et al.

It is certified that error appears in the above-identified patent and that said Letters Patent is hereby corrected as shown below:

Title page,
Item [57], ABSTRACT, Line 21, "gate-sidewall" should read -- gate-side-wall --.

Column 16,
Line 31, after "facet in", delete the comma ",".

Signed and Sealed this

Twenty-eighth Day of May, 2002

Attest:

JAMES E. ROGAN
*Attesting Officer*          *Director of the United States Patent and Trademark Office*